United States Patent [19]
Coules

[11] 3,952,232
[45] Apr. 20, 1976

[54] CIRCUIT BOARD EJECTOR
[75] Inventor: Ronald A. Coules, Chicago, Ill.
[73] Assignee: Richco Plastic Company, Chicago, Ill.
[22] Filed: June 3, 1974
[21] Appl. No.: 475,421

[52] U.S. Cl. .................... 317/101 DH; 16/114 R; 339/45 M
[51] Int. Cl.² .......................................... H02B 1/02
[58] Field of Search ............... 317/101 DH, 101 R; 339/45 M; 211/41; 16/114 R, 125, 126

[56] References Cited
UNITED STATES PATENTS
3,017,232  1/1962  Schwab et al. .................. 339/45 M
3,798,507  3/1974  Damon et al. ................ 317/101 DH OTHER PUBLICATIONS
"Vero Card Handles," Vero Electronics, Inc., 9–70.

Primary Examiner—David Smith, Jr.

[57] ABSTRACT

A circuit board ejector for snap-on attachment to an apertured circuit board or other electronic component slidably mounted in a rack or chassis, operable to initiate sliding of the circuit board for removal from or insertion into the chassis, and to a chassis — circuit board combination including such ejectors.

3 Claims, 6 Drawing Figures

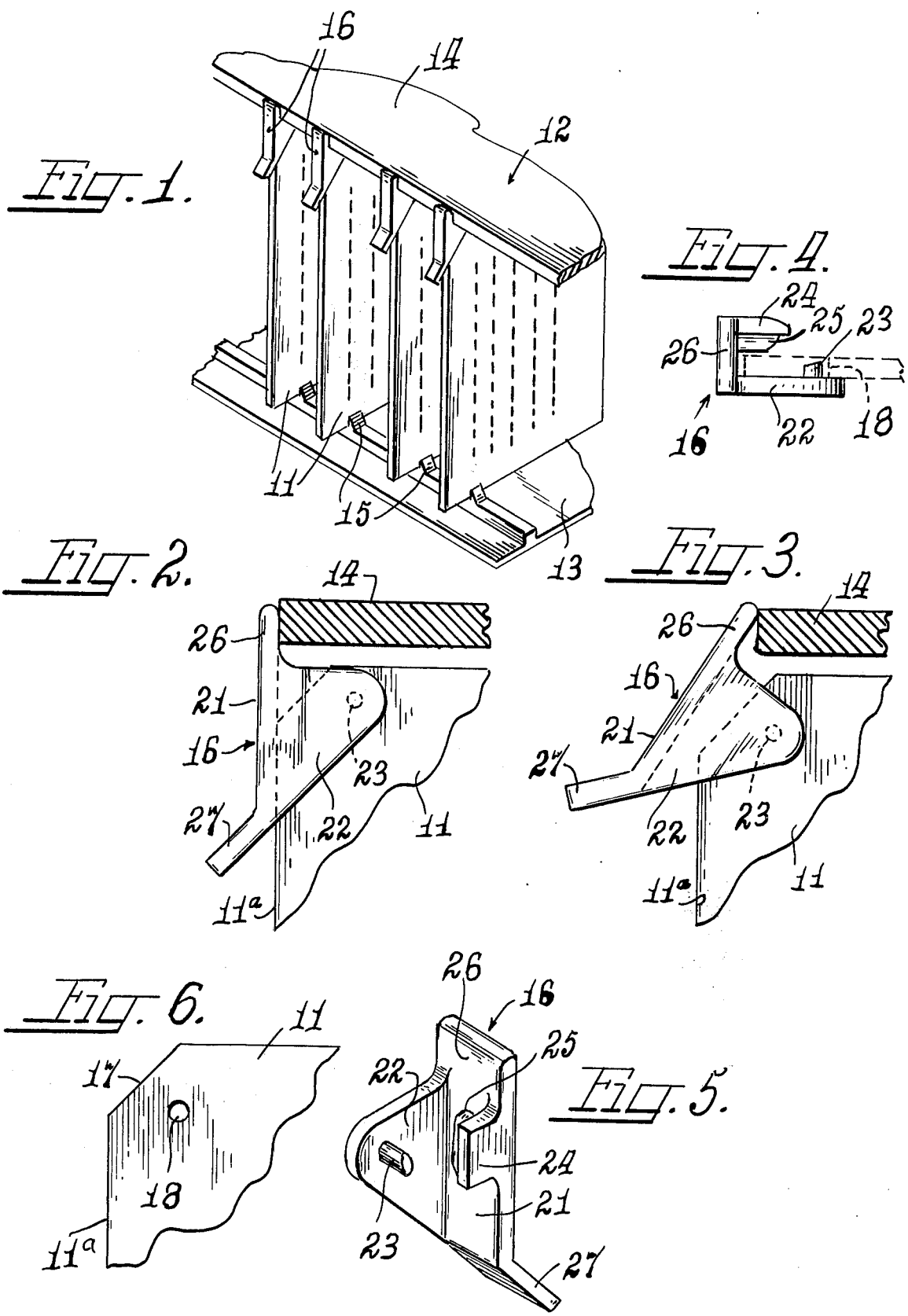

CIRCUIT BOARD EJECTOR

The invention relates to improvements in ejectors of a character that may be easily attached to a circuit board or other electronic component for facilitating removal of the board from its position in a chassis or rack and insertion therein.

In the electronic industry, circuit boards or other electronic components are arranged in association with a rack or chassis in spaced apart relation to one another, usually vertically. Frequently, it is necessary to withdraw a circuit board for repair or replacement. Experience has shown that it is often very difficult to initiate withdrawal of a board without damage to elements thereon due to many factors, such as, for example, the proximity of the boards to one another, a tight fit, a warped board, etc. Once withdrawal has been initiated, removal of the board is relatively easy. The present invention affords novel means to force final insertion and initial withdrawal of a board by use of a novel ejector which may be simply and inexpensively attached to the board, as by snapping it thereon, without the use of any special tools or hardware. It comprises, generally, a one-piece element suitably provided with integral means to snap engage pivotally the board and a finger tab which is easily manipulated manually to facilitate its being rocked into a position to bear against the chassis or rack and farcibly move the board into or withdraw the board from its normal position in the chassis.

It is therefore an object of the invention to provide a circuit board with ejector means.

Another object is to provide a novelly constructed circuit board ejector.

Another object is to provide an ejector with novel means to facilitate its attachment to a circuit board without use of special tools or hardware.

Another object is to provide an ejector of the character referred to which is not expensive or difficult to manufacture and which is very efficient in use.

Other objects and advantages of the invention will become apparent with reference to the following description and accompanying drawings. In the drawing:

FIG. 1 is a perspective view illustrating several circuit boards in place in a rack and each having the ejector of this invention mounted thereon.

FIG. 2 is an enlarged elevational view of the ejector mounted on a circuit board.

FIG. 3 is a view similar to FIG. 2, but showing the ejector positioned to withdraw a board from its rack.

FIG. 4 is a top plan view of the ejector.

FIG. 5 is a perspective view of the ejector.

FIG. 6 is a view of a fragment of the circuit board, illustrating the means for attaching an ejector thereto.

Referring to the exemplary embodiment of the invention as shown in the accompanying drawings, and particularly to FIG. 1, one or more circuit boards 11 or other electronic components are slidably mounted in a spaced apart position, usually vertically upright, in a rack or chassis 12. The chassis is characterized by having a floor 13 which serves to support the circuit boards and a top wall or rail 14 that overlies the boards. Each board is suitably held snuggly in the position shown by means of guides 15. Because of frictional resistance, it has been difficult to finally move the board into position or initially withdraw it therefrom; but to overcome this situation, each board is provided with a novel ejector 16.

As best shown in FIG. 6, each circuit board 11 has its upper lead corner cut back, as at 17, and is provided with a small aperture 18 adjacent thereto.

The ejector 16 is fabricated in one place from suitable rigid dielectric plastic insulating material, such as nylon, preferably by molding; and, as best shown in FIGS. 2, 4 and 5, the ejector includes an elongated wall or body 21 having extending along one longitudinal edge and from one face thereof a substantially triangular shaped wall 22 spaced below the upper end of body 21. The wall 22 has projecting inwardly from one face, at its apex, a stud 23 that is of a diameter to fit into the circuit board aperture 18 in a manner to be described presently.

The opposite longitudinal edge of the wall or body 21 has a rather narrow wall 24 projecting from the same face as wall 22. This wall 24 also terminates below the upper end of wall 21 and has on its side facing the triangular wall 22 a rib 25. The upper end portion 26 of the elongated wall or body 21 constitutes a cam-like surface provided for a purpose to be described hereinafter, whereas the lower end of said wall terminates in a finger piece or tab 27.

In use, the ejector 16 is mounted on the cut back corner 17 of the circuit board by being snapped into place. This mounting is perhaps best shown in FIG. 4, where it will be observed that the ejector is pushed onto the board with the latter lying between the two side walls 22 and 24, with the stud 23 engaged in the aperture 18 and the rib 25 substantially bearing against one face of the circuit board to prevent the board from backing off of the stud. The ejector is thus fixedly mounted pivotally on the circuit board and may be rotated about stud 23 into the two positions shown in FIGS. 2 and 3.

As illustrated in FIG. 2, when the ejector is lying in the plane of the front edge 11a of the circuit board 11, the upper end portion 26 of said ejector rests against the top rail 14 of the rack or chassis. To initiate removal of the circuit board, the finger piece or tab 27 is engaged and lifted upwardly and outwardly, pivoting the ejector about its pivot or stud 23, into the position shown in FIG. 3, so as to cause end portion 26 to bear firmly against the top rail 14, thus urging the circuit board outwardly from the rack whereupon it may be grasped and withdrawn easily. Final insertion of the board is accomplished in reverse order of the procedure set out for removal, by pressing against the tab 27 until the portion 26 bears against the rail 14.

By manipulating the ejectors 16 rather than the boards 11, damage to the circuit board components is avoided. The ejectors may be provided in a variety of colors to permit color coding of the circuit panels for quick identification.

Although I have described a preferred embodiment of my invention, in considerable detail, it will be understood that the description thereof is intended to be illustrative rather than restrictive, as details of the structure may be modified or changed without departing from the spirit or scope of the invention. Accordingly, I do not desire to be restricted to the exact construction described.

I claim:

1. An ejector for selectively inserting an apertured component into and withdrawing said component from a chassis, said ejector comprising an elongated body having a surface adapted to bear against said component, a pair of spaced apart walls extending from said body surface, one wall being substantially shorter and narrower than the other wall, a rib disposed between said walls, a stud on the other wall extending toward said one wall, said stud being spaced apart from said body surface and said one wall and adaptable to snap engage into said component aperture for pivotally mounting the ejector on said component, an end portion at one end of the body adapted for bearing against said chassis when the ejector is snap engaged on the component, and a finger tab on the end of said body opposite said end portion engageable to rock the body about the stud.

2. The ejector recited in claim 1, wherein said rib is disposed on the body surface spaced apart from said one wall.

3. The combination of a chassis having a stop at one end thereof, a circuit component slidably mounted in said chassis, and an ejector pivotally mounted on said circuit component, said ejector having a surface in contact with said chassis and said component, a pair of spaced apart walls extending from said surface one on each side of said component, means on one wall for pivotally engaging said component, a rib between said walls, the other wall being shorter and narrower than said one wall and spaced from said pivot means to permit said component to be snap engaged on the pivot and between the walls, and engageable means on the ejector to rock the ejector about said pivot means and against said chassis to selectively urge the circuit component toward and away from said chassis stop.

* * * * *